US006727658B2

(12) United States Patent
Ooae et al.

(10) Patent No.: US 6,727,658 B2
(45) Date of Patent: Apr. 27, 2004

(54) ELECTRON BEAM GENERATING APPARATUS AND ELECTRON BEAM EXPOSURE APPARATUS

(75) Inventors: Yoshihisa Ooae, Tokyo (JP); Yoichi Shimizu, Tokyo (JP); Takamasa Satoh, Tokyo (JP); Takeshi Haraguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/383,953

(22) Filed: Mar. 7, 2003

(65) Prior Publication Data

US 2003/0155522 A1 Aug. 21, 2003

Related U.S. Application Data

(63) Continuation of application No. PCT/JP01/10019, filed on Nov. 16, 2001.

(51) Int. Cl.[7] .................................................. G09G 3/10
(52) U.S. Cl. ............................... 315/169.1; 315/169.3; 315/381; 315/382; 250/492.3; 378/138; 378/134
(58) Field of Search ..................... 315/368.15, 381, 315/382, 39.57, 39.63, 169.1, 169.3; 313/337, 348, 310, 306; 250/396 R, 492.2, 492.22, 492.3, 492.23; 345/74.1; 378/134, 136, 137, 138, 145

(56) References Cited

U.S. PATENT DOCUMENTS 3,806,760 A * 4/1974 Shimada .................. 345/74.1
4,489,254 A * 12/1984 Koinuma et al. ........ 315/39.51
5,403,989 A * 4/1995 Tobuse et al. ........... 219/121.2

FOREIGN PATENT DOCUMENTS

JP 11087206 A * 3/1999 .......... H01L/21/027

* cited by examiner

*Primary Examiner*—Haissa Philogene
(74) *Attorney, Agent, or Firm*—Morrison & Foerster LLP

(57) ABSTRACT

An electron beam generating apparatus for generating a plurality of electron beams, which includes: a plurality of cathodes for generating thermoelectrons; a cathode power supply unit for applying negative voltage to the cathodes so as to emit the thermoelectrons from the cathodes; a plurality of grids, which correspond to the plurality of cathodes respectively, for focusing the thermoelectrons emitted from each of the plurality of cathodes, and shaping the plurality of electron beams; and an insulator on which the plurality of cathodes and the plurality of grids are attached.

19 Claims, 5 Drawing Sheets

ELECTRON BEAM GENERATING APPARATUS AND ELECTRON BEAM EXPOSURE APPARATUS

The present application is a continuation application of PCT application No. PCT/JP01/10019 filed on Nov. 16, 2001. The present application claims priority from a Japanese Patent Application No. 2000-360067 filed on Nov. 27, 2000, the contents of which are incorporated herein by reference.

BACKGROUND OF THE INVENTION

1. Field of the Invention

The present invention relates to an electron beam exposure apparatus for exposing a wafer by an electron beam. More particularly, it pertains to an electron beam exposure apparatus for generating a plurality of electron beams and exposing a wafer.

2. Description of the Related Art

A conventional electron beam generating apparatus includes an electron gun which includes a cathode for generating thermoelectrons, a grid for focusing the thermoelectrons generated by the cathode and for generating an electron beam, and an insulator for attaching the cathode and the grid, and a wafer is exposed by the electron beam generated by the single electron gun.

Recently, with expansion of demand of semiconductor devices, improvement in production rate of semiconductor devices is expected. However, since a wafer is exposed by single electron beam for generating the semiconductor devices in a conventional electron beam exposure apparatus, it is difficult to maintain sufficient production rate. Moreover, when it includes simply a plurality of above-mentioned electron guns to generate a plurality of electron beams, it is difficult to control the plurality of electron guns individually and it is also difficult to control electric discharge due to a number of thermoelectrons which are generated when the plurality of electron beams are generated.

SUMMARY OF THE INVENTION

In order to solve the aforesaid problem, according to the first aspect of the present invention, there is provided an electron beam generating apparatus for generating a plurality of electron beams. The electron beam generating apparatus includes: a plurality of cathodes for generating thermoelectrons; a cathode power supply unit for applying negative voltage to the cathodes so as to emit the thermoelectrons from the cathodes; a plurality of grids, which correspond to the plurality of cathodes respectively, for focusing the thermoelectrons emitted from each of the plurality of cathodes, and shaping the plurality of electron beams; and an insulator on which the plurality of cathodes and the plurality of grids are attached.

In the first aspect of the present invention, the cathode power supply unit may include a plurality of cathode power supplies, and each of the plurality of cathode power supplies may apply negative voltage to the plurality of cathodes. Moreover, the plurality of cathodes may be arranged in a gridiron pattern, and voltage may be applied to the plurality of cathodes, to which voltage is applied from one of the cathode power supplies, in accordance with a distance from a center of the gridiron pattern. Moreover, the electron beam generating apparatus may further include a first dummy electrode, which is positioned outside of outermost grids among the plurality of grids, on substantially the same surface as bottom surface of the insulator on which the plurality of grids are attached, and at substantially the same height as that of the outermost grids in a direction substantially perpendicular to the insulator.

The first dummy electrode may include a projection which projects from the surface, on which the plurality of grids are provided, to substantially opposite direction of the plurality of grids. Moreover the insulator may include: a high resistance film for covering at least a part of external surface of the insulator; a first electrode electrically connected to an upper part of the high resistance film; and a second electrode electrically connected to a lower part of the high resistance film. The second electrode may be electrically connected to one of the plurality of grids through the first dummy electrode, where substantially the same electric potential as the connected grid is applied, and substantially zero electric potential is applied to the second electrode. Moreover the electron beam generating apparatus may further include a second dummy electrode, which is positioned in a space insulated from the plurality of cathodes and the plurality of grids by the insulator, and electrically connected to the first dummy electrode. Moreover the second dummy electrode may be positioned so as to surround a connection unit which connects the cathode and the cathode power supply unit.

The plurality of grids may be arranged so that insulation resistance due to a clearance distance between one of the grids and another grid which adjoins the grid is lower than insulation resistance due to a creepage distance between one of the grids and another grid which adjoins the grid over surface of the insulator. Moreover, the electron beam generating apparatus may further include a plurality of cathode voltage fine adjustment units, which are positioned corresponding to the cathodes respectively, for adjusting voltage applied to each of the cathodes at higher resolution than that of the voltage generated by the cathode power supply. Moreover, the electron beam generating apparatus may further include a plurality of grid power supplies for applying voltage to each of the grids in accordance with electric potential of each of the cathodes which corresponds to each of the grids.

Moreover, the electron beam generating apparatus may further include a plurality of grid control units for controlling each of the plurality of grid power supplies so as to detect emission current which flows to each of the cathodes in accordance with an amount of the thermoelectrons generated by the plurality of cathodes, and to maintain each of the detected emission current to be substantially constant. Moreover the electron beam generating apparatus may further include: a plurality of filament current sources for supplying filament current for heating the cathodes to the plurality of cathodes respectively; a heating-current adjustment unit for adjusting current value of the filament current at each of the cathodes; and a heating-current control unit for controlling the current value of the filament current, which is adjusted by each of the heating-current adjustment units based on the current value of the plurality of electron beams which is to be shaped by the plurality of grids. Moreover the electron beam generating apparatus may further include a high tension cable including: a plurality of cathode cables for applying the filament current to each of the plurality of cathodes to which one of the cathode power supplies applies negative voltage; a plurality of grid cables for electrically connecting the plurality of grids and the plurality of grid power supplies, where each of the plurality of grids is corresponding to each of the plurality of cathodes to which one of the cathode power supplies applies negative voltage; an insulator for insulating the plurality of grid cables; and a shield which surrounds the insulator and of which electric potential is substantially the same as one of the plurality of cathodes.

Moreover, it is preferable that surface area of each of the cathodes is less than 3.5 square millimeters, and volume of each of the cathodes is more than 0.2 cubic millimeters. Moreover, the electron beam generating apparatus may further include a reflux unit for circulating insulating gas or insulating coolant to a space insulated from the plurality of cathodes and the plurality of grids by the insulator. Moreover the electron beam generating apparatus may further include a temperature control unit for controlling flow rate of the insulating gas or the insulating coolant in the reflux unit so as to maintain temperature of the insulator to be substantially constant.

According to the second aspect of the present invention, there is provided an electron beam exposure apparatus for exposing a wafer by an electron beam. The electron beam exposure apparatus includes: an electron beam generating apparatus for generating the electron beam; a deflector for deflecting the electron beam into a desired position on the wafer; and a stage for supporting the wafer. The electron beam generating apparatus includes: a plurality of cathodes for generating thermoelectrons; a cathode power supply unit for applying negative voltage to the cathodes so as to emit the thermoelectrons from the cathodes; a plurality of grids, which correspond to the plurality of cathodes respectively, for focusing the thermoelectrons emitted from each of the plurality of cathodes, and shaping the plurality of electron beams; and an insulator on which the plurality of cathodes and the plurality of grids are attached. The electron beam exposure apparatus may further include: a chamber for storing the electron beam generating apparatus, the deflector, and the stage; and a pressure reduction means for reducing a pressure of inside of the chamber. A vacuum area, of which the pressure is reduced by the pressure reduction means, in the chamber may be surrounded by a high resistance film or a conductor.

This summary of invention does not necessarily describe all necessary features so that the invention may also be a sub-combination of these described features.

DETAILED DESCRIPTION OF THE INVENTION

The invention will now be described based on the embodiments hereinafter, which do not intend to limit the scope of the present invention as defined in the appended claims. All of the features and the combinations thereof described in the embodiments are not necessarily essential to the invention.

Figure 1:
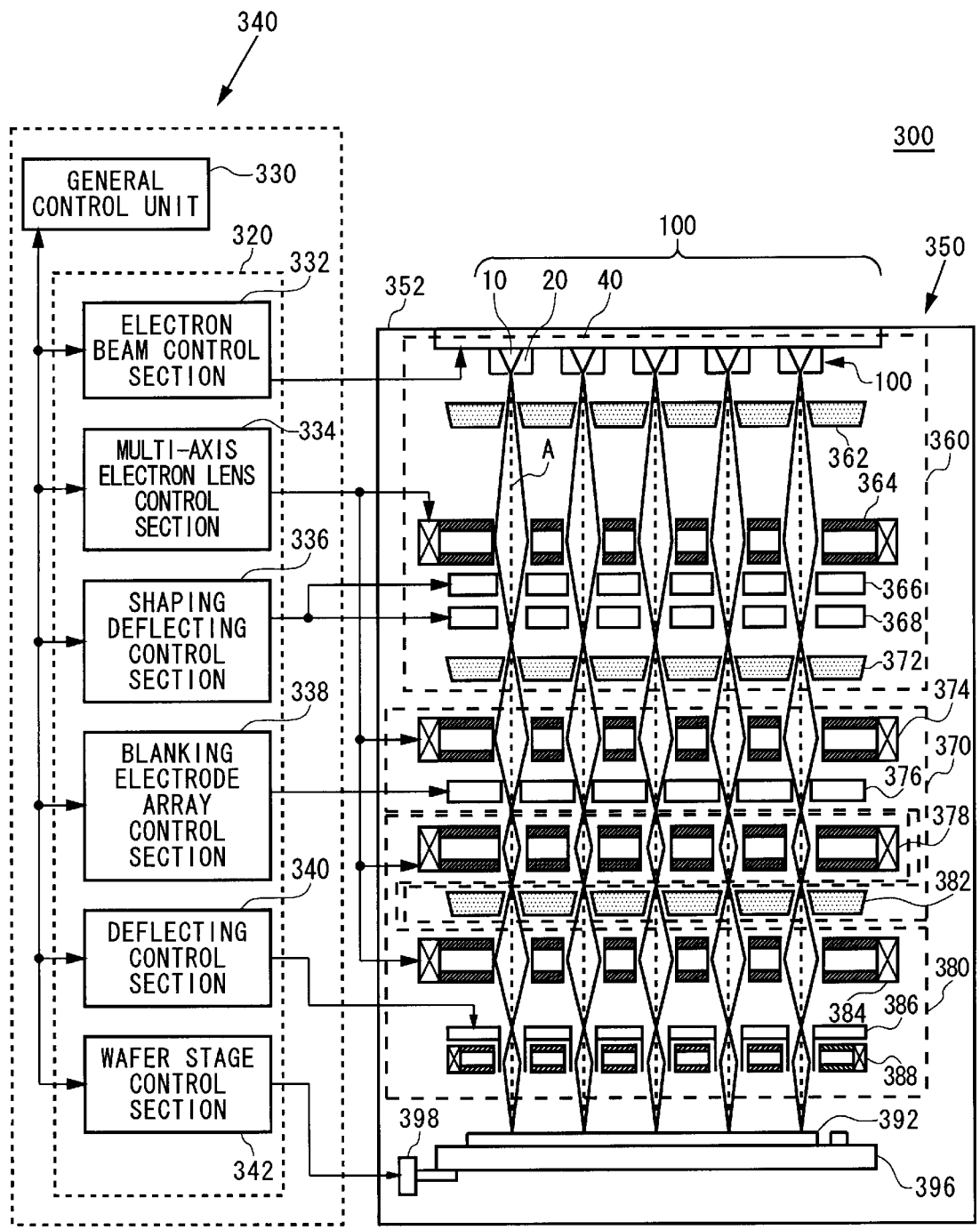
FIG. 1 shows a configuration of an electron beam exposure apparatus 300 according to an embodiment of the present invention.

FIG. 1 shows a configuration of an electron beam exposure apparatus 300 according to an embodiment of the present invention. The electron beam exposure apparatus 300 includes an exposing unit 350 for exposing a wafer 392 by electron beams, and a control system 340 for controlling the operation of each of elements in the exposing unit 350.

The exposing unit 350 includes an electron optics system which includes an electron beam shaping means 360 for generating a plurality of electron beams and shaping cross-sectional shape of the electron beams into desired shapes inside a chamber 352, an irradiation switching means 370 for independently switching whether or not the plurality of electron beams are to be irradiated on the wafer 392, and a wafer projection system 380 for adjusting direction and size of an image of a pattern which is transcribed on the wafer 392. The exposing unit 350 also includes a stage section including a wafer stage 396 for supporting the wafer 392 on which the pattern is exposed, and a wafer stage drive unit for driving the wafer stage 396.

The electron beam shaping means 360 includes an electron beam generating apparatus 100 for generating a plurality of electron beams, a first shaping member 362 and a second shaping member 372 having a plurality of openings which shape the cross-sectional shape of the irradiated electron beams by allowing the electron beams to pass through the openings, a first multi-axis electron lens 364 for adjusting a focal point of the plurality of electron beams by independently focusing each of the plurality of electron beams, and a first shaping deflector 366 and a second shaping deflector 368 for independently deflecting the plurality of electron beams which have passed through the first shaping member 368.

The electron beam generating apparatus 100 includes: a plurality of cathodes 10 for generating thermoelectrons; a cathode power supply unit (not shown) for applying negative voltage to the cathodes 10 so that the thermoelectrons are emitted from the cathodes 10; a plurality of grids 20, each of which corresponds to each of a plurality of cathodes 10, for respectively focusing the thermoelectrons emitted from each of the plurality of cathodes 10, and for shaping the plurality of electron beams; a plurality of grid power supplies (not shown) for applying voltage to each of the grids 20 in accordance with electric potential of each of the cathodes 10 which corresponds to each of the grids 20; and an insulator 40 on which the plurality of cathodes 10 and the plurality of grids 20 are attached. It is preferable that at least a part of external surface of the insulator 40 is covered with high electric resistance film. It is also preferable that an upper part of the high electric resistance film is connected to the chamber 352, and the chamber 352 is grounded. It is also preferable that a lower part of the high electric resistance film is electrically connected to the grids 20. Negative voltage is applied to the grid 20 from the grid power supply, and substantially the same electric potential as the grid 20 is applied to the lower part of the high electric resistance film. Minute electric current flows on the high electric resistance film by electric potential difference between the upper part of the high electric resistance film and the lower part of the high electric resistance film, so that accumulation of the thermoelectrons emitted from the cathode 10 on a surface of the insulator 40 is avoided.

The exposure switching unit 370 includes a second multi-axis electron lens 374 for adjusting a focal point of a plurality of electron beams by independently focusing each of a plurality of electron beams, a blanking electrode array 376 for independently switching whether or not each of the electron beams is to be irradiated on the wafer 392 by deflecting each of the plurality of electron beams independently, and an electron beam blocking unit 136, which includes a plurality of openings through which the electron beams pass, for blocking the electron beam deflected by the blanking electrode array 376. In another embodiment, the blanking electrode array 376 is a blanking aperture array device.

The wafer projection system 380 includes a third multi-axis electron lens 378 for independently focusing each of a plurality of electron beams and decreasing irradiated cross-sectional area of the electron beams, a fourth multi-axis electron lens 384 for independently focusing each of a plurality of electron beams and adjusting a focal point of each of the electron beams, a deflecting unit 386 for independently deflecting each of the plurality of electron beams into a desired location on the wafer 392, and a fifth multi-axis electron lens 388, which acts as an object lens for the wafer 392, for independently focusing each of the plurality of electron beams.

The control system 340 includes a general control unit 330 and an individual control unit 320. The individual control unit 320 includes an electron beam control section 332, a multi-axis electron lens control section 334, a shaping deflecting control section 336, a blanking electrode array control section 338, a deflecting control section 340, and a wafer stage control section 342. For example, the general control unit 330 is a workstation which generally controls each of the controllers included in the individual control unit 320.

The electron beam control section 332 controls the electron beam generating apparatus 100. The multi-axis electron lens control section 334 controls electric current provided to the first multi-axis electron lens 364, the second multi-axis electron lens 374, the third multi-axis electron lens 378, the fourth multi-axis electron lens 384, and the fifth multi-axis electron lens 388. The shaping deflecting control section 336 controls the first shaping deflector 366 and the second shaping deflector 368. The blanking electrode array control section 338 controls voltage applied to deflection electrodes of the blanking electrode array 376. The deflecting control section 344 controls voltage applied to the deflection electrodes of a plurality of deflectors of the deflecting unit 386. The wafer stage control section 342 controls the wafer stage driver 398 so that the wafer stage 396 is caused to move to a predetermined location.

Figure 2:
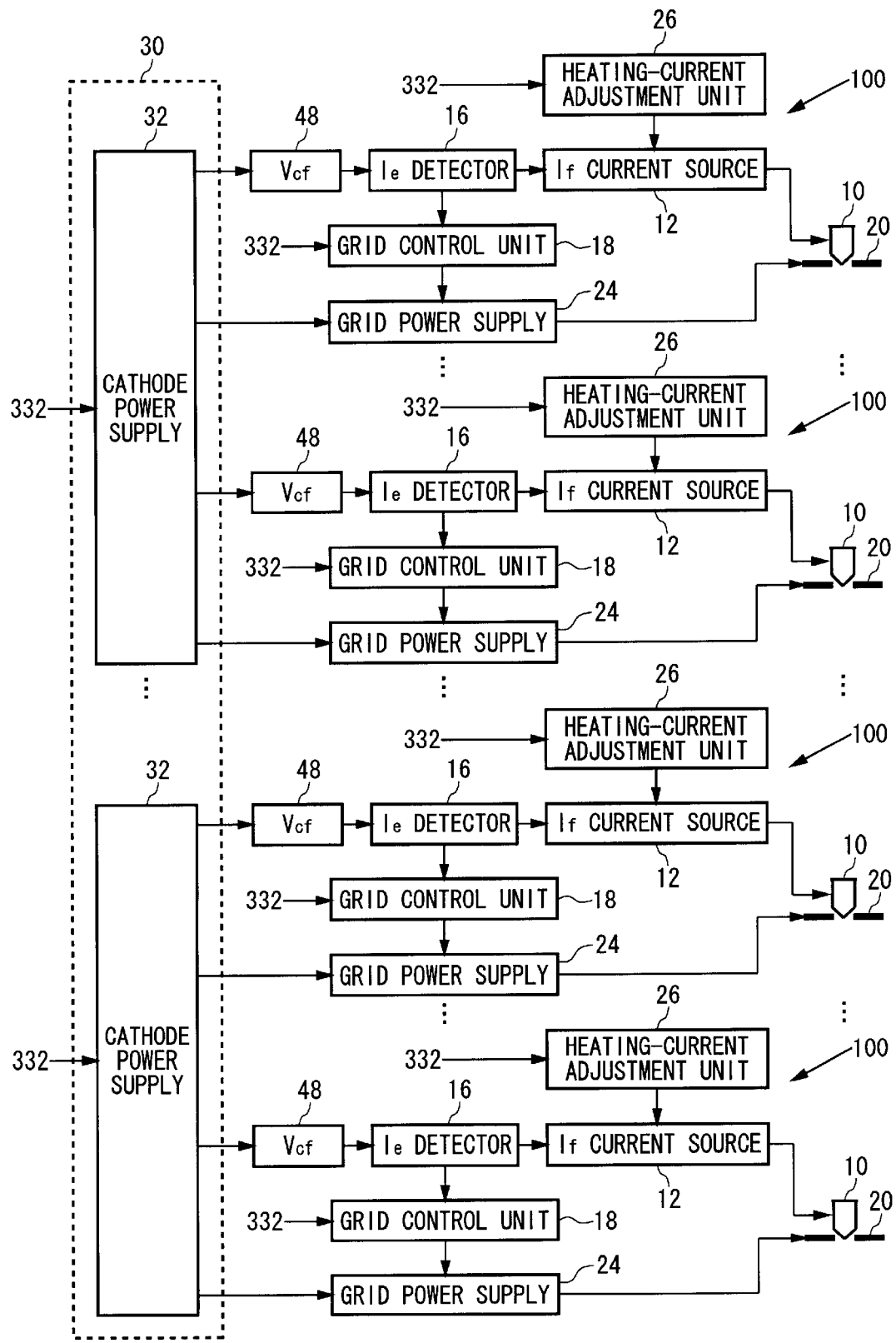
FIG. 2 shows an example of a configuration of a power supply system of an electron beam generating apparatus 100.

FIG. 2 shows an example of a configuration of a power supply system of the electron beam generating apparatus 100. The electron beam generating apparatus 100 includes a plurality of cathodes 10, a plurality of grids 20, a plurality of filament current sources 12, a plurality of heating-current adjustment units 26, a plurality of current detectors 16, grid control units 18, grid power supplies 24, cathode voltage fine adjustment units 48, and a cathode power supply unit 30. As shown in FIG. 2, the cathode power supply unit 30 includes a plurality of cathode power supplies 32, and each of the plurality of cathode power supplies 32 applies negative voltage to the plurality of cathodes 10. That is, the plurality of cathodes 10 shares one of the cathode power supplies 32. Hereinafter, a power supply system which connects with a pair of the cathode 10 and the grid 20, and control of the power supply system will be explained.

The electron beam control section 332 controls voltage of each of the cathode power supplies 32 which is applied to the plurality of cathodes 10. The acceleration voltage, which is a sum of voltage of the cathode power supply 32 and the cathode voltage fine adjustment unit 48, is applied to the cathode 10. The cathode voltage fine adjustment unit 48 generates voltage, of which resolution is higher than that of the voltage generated by the cathode power supply 32, and applies it to the cathode 10. Moreover, it is preferable that each of the cathode voltage fine adjustment units 48 changes the voltage applied to each of the cathodes 10 based on individual difference such as difference of resistance among the plurality of cathodes 10. The electron beam control section 332 may independently control the voltage of each of the cathode voltage fine adjustment units 48 which is applied to each of the cathodes 10. It is also preferable that speed for increasing and decreasing the voltage of each of the plurality of cathode power supplies 32 is substantially same as each other. By controlling the increasing speed and the decreasing speed of the voltage of each of the plurality of cathode power supplies 32, electric discharge, which is caused by startup of the apparatus or the like, is avoided.

The grid power supply 24 applies voltage to each of the grids 20 so that electric potential of the each of the grid 20 becomes lower than that of the corresponding cathode 10. A sum of the voltage of the cathode power supply 32 and the voltage of the grid power supply 24 is applied to the grid 20. For example, when the cathode power supply 32 generates voltage of −50 kilovolts and the grid power supply 24 generates voltage of −2 kilovolts, voltage of about −50 kilovolts is applied to the cathode 10, and voltage of about −52 kilovolts is applied to the grid 20.

The cathode 10 generates thermoelectrons when it is heated by filament current supplied from the filament current source 12. The generated thermoelectrons are emitted from the cathode 10 by the negative voltage applied to the cathode 10. For example, it is preferable that the thermoelectrons are emitted in the direction of a wafer by grounding the first shaping member 362, stage 396, etc., which function as anodes, to generate electric potential difference between the cathode 10 and the anodes. The heating-current adjustment unit 26 adjusts filament current of the filament current source 12 applied to the cathode 10. Since the amount of the thermoelectrons emitted from the cathode is adjustable by adjusting the filament current, a current value of the electron beam is adjustable. The electron beam control section 332 may supply information of the current value of the electron beam which is to be generated in the heating-current adjustment unit 26, and the heating-current adjustment unit 26 may adjust the filament current of the filament current source 12 applied to the cathode 10 based on the information of the current value of the electron beam. Alternatively, the electron beam generating apparatus 100 further includes a heating-current control unit for controlling the current value of the filament current, which is adjusted by the heating-current adjustment unit 26 based on the current value of the electron beam which is to be shaped by the grid 20. Emission current flows in the cathode 10 in accordance with the amount of the generated thermoelectrons. The thermoelectrons emitted from the cathode 10 are focused by the grid 20 to which lower voltage than the cathode 10 is applied. Moreover, based on the voltage value applied to the cathode 10, the amount of the thermoelectrons emitted from the cathode 10, i.e., the current value of the electron beam, changes.

The current detector 16 detects the emission current which flows to the cathode 10. Based on the emission current detected by the current detector 16, the grid control unit 18 controls the voltage of the grid power supply 24 applied to the grid 20 and the current value of the electron beam. For example, the grid control unit 18 controls each of the grid power supplies 24 so as to maintain each of the detected emission current to be substantially constant. The electron beam control section 332 controls the grid control unit 18 based on the current value of the electron beam which is to be generated. For example, the electron beam control section 332 controls the voltage value of the grid power supply 24, which is controlled by the grid control unit 18, to maintain the current value of the electron beam at a predetermined value. The grid control unit 18 controls the voltage value of the grid power supply 24 to maintain each of the emission current which flows in each of the plurality of cathodes 10 to be substantially constant. The current value of each of the electron beams is adjusted by controlling one parameter of the filament current value by controlling the voltage value of the grid power supply 24 so that each of the emission current which flows in each of the plurality of cathodes 10 is maintained to be substantially constant.

While the power supply system which connects with a pair of the cathode 10 and the grid 20 and the control of the power supply system have been described hereinbefore, another power supply system which connects with another pair of the cathode 10 and the grid 20 and the control of the other power supply system have the same function and operation as those of the above-described embodiment. According to the electron beam generating apparatus 100 described above, the amount of the thermoelectrons emitted by the plurality of cathodes 10, and the current value of the electron beam to be shaped by the plurality of grids 20 are independently controllable for each of the plurality of cathodes 10 and each of the plurality of grids 20. Moreover, since each of the cathode power supplies 32 applies the voltage to the plurality of cathodes 10 and the plurality of cathodes 10 connect with the plurality of cathode voltage fine adjustment units for finely adjusting the voltage, there is no necessity of connecting a mass power supply to each of the plurality of cathodes 10, and capacity of the power supply required for the electron beam generating apparatus 100 becomes small. Arrangement of the cathode 10 and the grid 20, to which the voltage is applied by each of the cathode power supply 32, will be described hereinafter.

Figure 3A:
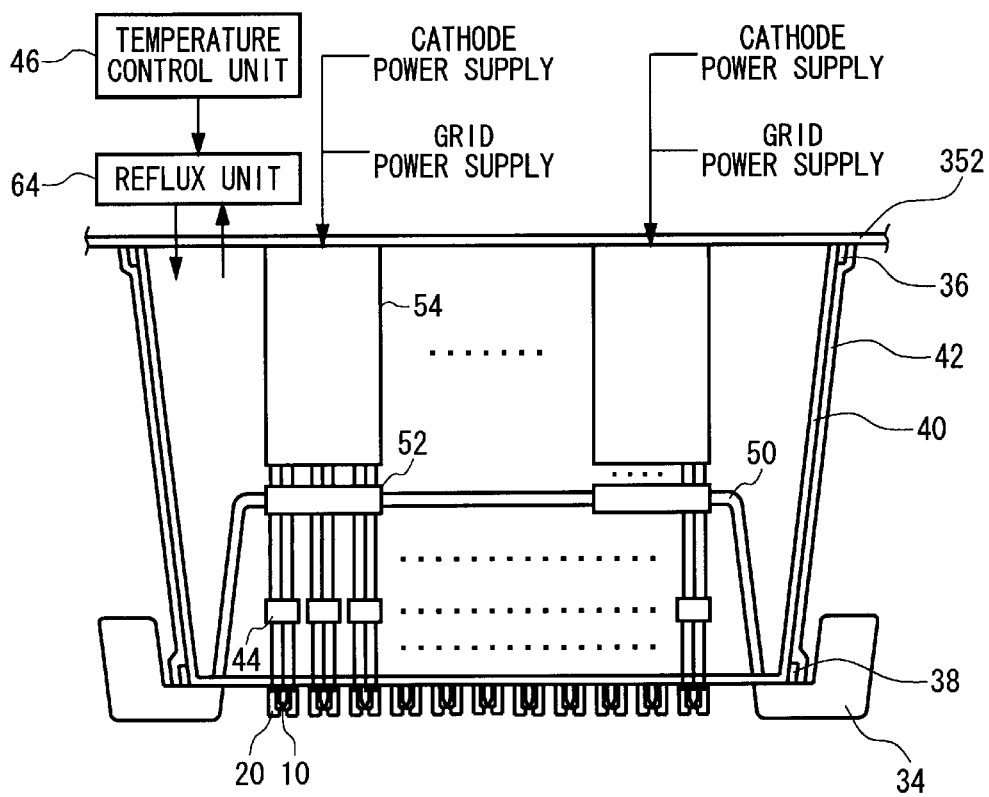
FIGS. 3(A, B) is a drawing exemplary showing arrangement of a plurality of cathodes 10 and a plurality of grids 20 attached on an insulator 40.
Figure 3B:
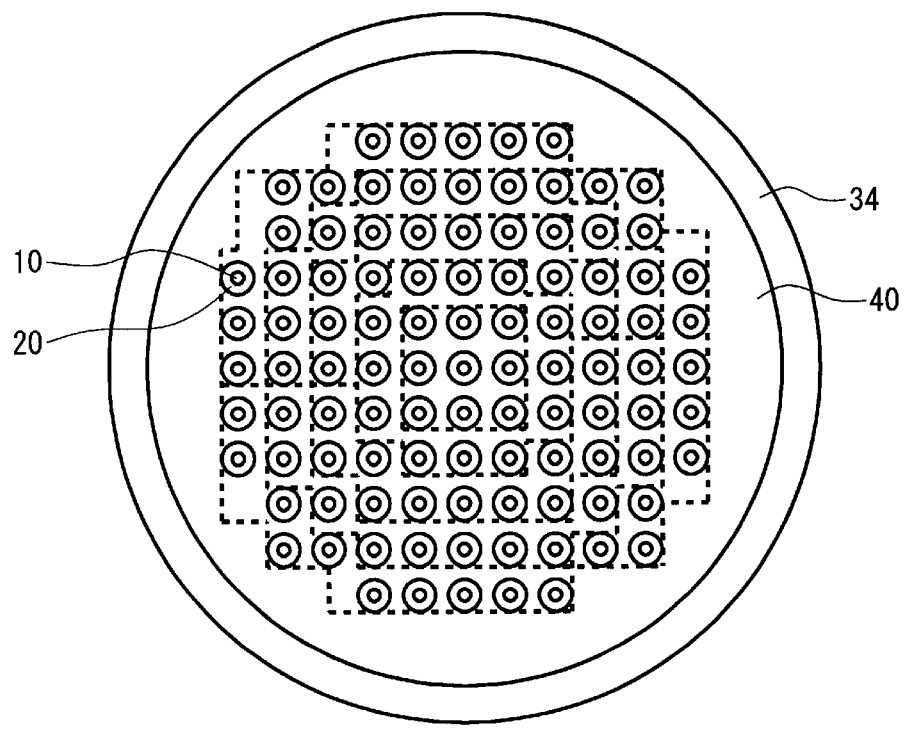

FIG. 3 is a drawing exemplary showing arrangement of the plurality of cathodes 10 and the plurality of grids 20 attached on the insulator 40. FIG. 3A is a sectional view of the insulator 40, and FIG. 3B shows a bottom of the insulator 40 on which the plurality of cathodes 10 and the plurality of grids 20 are attached. The plurality of cathodes 10 and the plurality of grids 20 attached on the bottom of the insulator 40, as shown in FIG. 3A, are arranged in a gridiron pattern, as shown in FIG. 3B. In this example, voltage is applied by one of the cathode power supplies 32 to the cathodes 10 and the grids 20 which are located inside of an area bounded by dotted lines in FIG. 3B. That is, equal voltage is applied from one of the power supplies 32 to the plurality of cathodes 10 and the plurality of grids 20 which are at substantially equal distance from center of the gridiron pattern.

As shown in FIG. 3B, the voltage is applied from one of the cathode power supply 32 to the plurality of cathodes 10 in accordance with the distance from the center of the gridiron pattern. For example, even if there is a temperature gradient at the bottom of the insulator 40, influence of the temperature gradient is eliminated and the current value of the electron beam is controllable by applying the voltage in accordance with the distance from the center of the gridiron pattern.

Moreover, it is preferable that the electron beam generating apparatus 100 further includes a first dummy electrode 34, which is positioned outside of outermost grids 20 among the plurality of grids 20, on substantially the same surface as bottom surface of the insulator 40 on which the plurality of grids 20 are attached, and at substantially the same height as that of the outermost grids 20 in a direction substantially perpendicular to the insulator 40. As shown in FIG. 3B, it is preferable that the first dummy electrode 34 is provided in the perimeter of the plurality of cathodes 10 and the plurality of grids 20 so that the first dummy electrode 34 surrounds the plurality of cathodes 10 and the plurality of grids 20. By including the first dummy electrode 34 which is positioned at substantially the same height as that of the outermost grids 20, electric field, which is generated around the outermost grids 20 and electric field generated around the other grids 20, due to the voltage applied to the plurality of cathodes 10 and the plurality of grids 20 is maintained uniformly. By maintaining the uniformity of the electric field generated around the grids 20, the current value of the plurality of electron beams irradiated from the plurality of cathodes 10 and the plurality of grids 20 are controlled accurately. Moreover, electric discharge by concentration of the electric field is prevented by maintaining the uniformity of the electric field. It is preferable that the first dummy electrode 34 includes a projection which projects from a surface, on which the plurality of grids 20 are provided, to substantially opposite direction of the plurality of grids 20. As shown in FIG. 3A, since the first dummy electrode 34 includes the projection and the projection covers a part of side of the insulator 40, accumulation of the thermoelectrons, which are emitted from the cathodes 10, on the side of the insulator 40 is prevented and the electric discharge due to the accumulation of the thermoelectrons is controlled.

Moreover, it is preferable that the insulator 40 includes a high resistance film 42 for covering at least a part of external surface of the insulator 40, a first electrode 36 electrically connected to an upper part of the high resistance film 42, and a second electrode 38 electrically connected to a lower part of the high resistance film 42. It is also preferable that the second electrode 38 is electrically connected to one of the plurality of grids 20 through the first dummy electrode 34, where substantially the same electric potential as the connected grid 20 is applied, and substantially zero electric potential is applied to the second electrode 38. Minute current flows on the high resistance film 42 by the electric potential difference between the second electrode 38 and the first electrode 36, so that accumulation of the thermoelectrons on the side of the insulator 40 is prevented, and the electric discharge due to the accumulation of the thermoelectrons is prevented. It is preferable that a value of resistance of the high resistance film 42 is selected so as to prevent overload of the grid power supply 24. For example, when a voltage of −50 kilovolts is applied to the grid 20, it is preferable that the resistance between the upper part of the high resistance film 42 and the lower part of the high resistance film 42 is in the neighborhood of 0.5 to 500 gigaohms. In this case, the current of about 0.1–100 microamperes flows between the upper part and the lower part of the high resistance film 42, so that the accumulation of the electric charge due to the thermoelectrons on the high resistance film 42 is prevented, and the overload of the grid voltage source 24 is also prevented. Moreover, it is preferable that the high resistance film 42 includes metal oxide, such as indium oxide. In this case, the high resistance film 42 may be hyaline material in which the indium oxide is mixed substantially evenly. By the high resistance film 42 including the indium oxide, it is easy to manufacture the high resistance film 42 of which the value of resistance between the upper part of the high resistance film 42 and the lower part of the high resistance film 42 is in the neighborhood of 0.5 to 500 gigaohms.

Moreover, it is preferable that the electron beam generating apparatus 100 further includes a second dummy electrode 50, which is positioned in a space insulated from the plurality of cathodes 10 and the plurality of grids 20 by the insulator 40, and electrically connected to the first dummy electrode 34. It is preferable that the second dummy electrode 50 is positioned so as to surround a connection unit 44 which connects the cathodes 10 and the cathode power supply unit 30. The connection unit 44 connects a cable for the cathode power supply 32 of the cathode power supply unit 30 applying voltage to the cathode 10, and a cable for the cathode 10 receiving the voltage. For example, the connection unit 44 is a connector or the like. There may be included a plurality of connection units 44 corresponding to each of the cathodes 10, and one of the connection units 44 connects one of the cathode power supply 32 and the plurality of cathodes 10. Alternatively, the second dummy electrode 50 includes a cable-passing unit 52 for passing the cable. By the second dummy electrode 50, concentration of electric field on the insulator 40 is decreased, and the electric field around the connection unit 44 is decreased.

Moreover, it is preferable that a high tension cable 54 includes a plurality of cathode cables for applying filament current to each of the plurality of cathodes 10 to which one of the cathode power supplies 32 applies negative voltage, and a plurality of grid cables for electrically connecting the plurality of grids 20 and the plurality of grid power supplies, where each of the plurality of grids 20 is respectively corresponding to each of the plurality of cathodes 10 to which one of the cathode power supplies 32 applies negative voltage. In this case, it is preferable that the high tension cable 54 includes an insulator for insulating the plurality of grid cables, and a shield which surrounds the insulator and of which electric potential is substantially the same as one of the plurality of cathodes 10 connected to the plurality of cathode cables.

Moreover, it is preferable that surface area of each of the plurality of cathodes 10 is less than 3.5 square millimeters, and volume of each of the cathodes 10 is more than 0.2 cubic millimeters. For example, when each of the cathodes 10 includes a thermionic emission material for emitting thermoelectrons and two heaters provided on both sides of the thermionic emission material, electric power consumption for heating is less than 2 watts by making the surface area of each of a plurality of cathodes 10 to be less than 3.5 square millimeters, and the volume of each a plurality of cathodes 10 to be more than 0.2 cubic millimeters. For this reason, since the electron beam generating apparatus 100 is operated with low heat generation, deterioration of degree of vacuum inside the chamber 352 due to temperature rise is prevented, and the electron beam is controlled accurately. Moreover, by making the size of cathode 10 to be the aforesaid size, the cathode 10 is physically retainable, and problems, such as increase of contact pressure and increase of electric contact resistance, are avoidable.

Moreover, the electron beam generating apparatus 100 further includes a reflux unit 64 for circulating insulating gas or insulating coolant to a space insulated from the plurality of cathodes 10 and the plurality of grids 20 by the insulator 40. For example, the reflux unit 64 circulates perfluorinated liquid coolant, insulating gas such as sulfur hexafluoride or the like. Moreover, it is preferable that the reflux unit 64 pressurizes the insulating gas, such as sulfur hexafluoride, and circulates it. Moreover, it is preferable that the electron beam generating apparatus 100 further includes a temperature control unit 46 for controlling flow rate of the insulating gas or the insulating coolant in the reflux unit 64 so as to maintain temperature of the insulator 40 to be substantially constant. By maintaining the temperature of the space inside the insulator 40 substantially constant, thermal expansion of the bottom of the insulator 40, on which the cathodes 10 and the like are attached, is reduced, and optical axis of the electron beam is stabilized.

Moreover, it is preferable that the plurality of grids 20 are arranged so that insulation resistance due to a clearance distance between a certain grid 20 and another grid 20 which adjoins the certain grid 20 is lower than insulation resistance due to a creepage distance between a certain grid 20 and another grid 20 which adjoins the certain grid 20 over the surface of the insulator 40.

Figure 4:
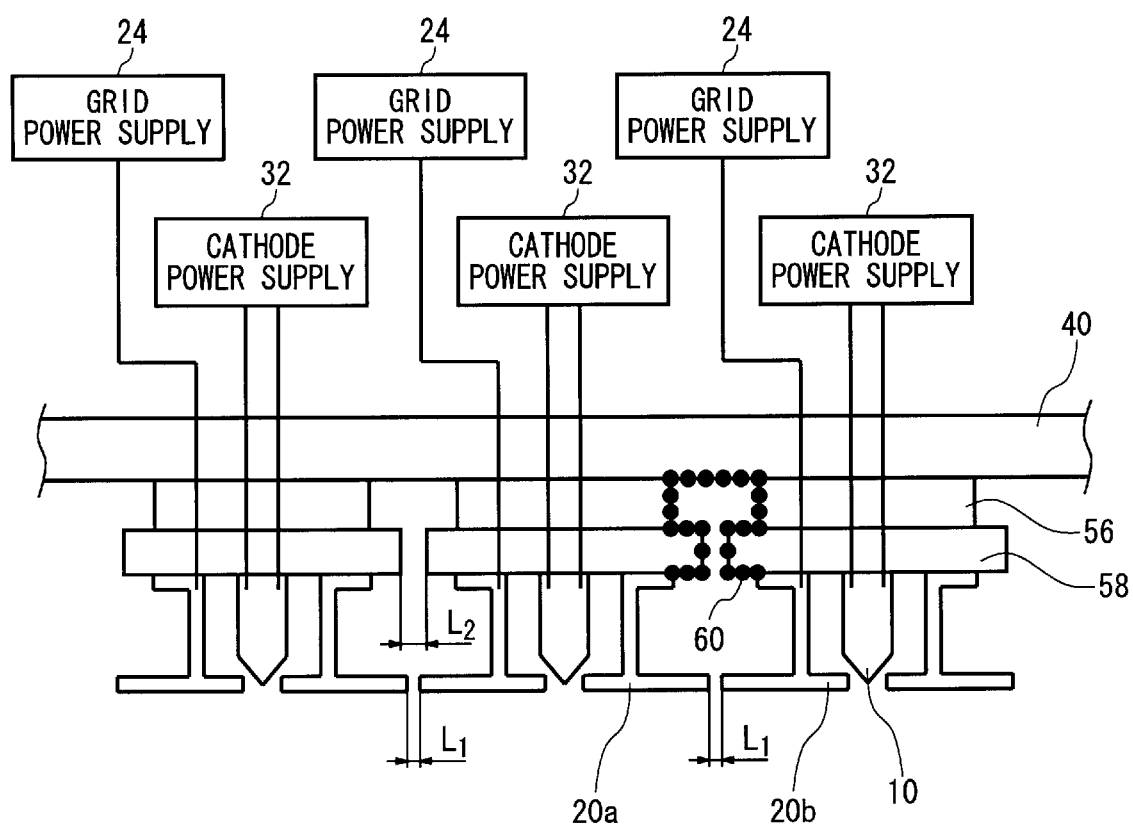
FIG. 4 is a drawing exemplary showing insulation resistance between a certain grid 20 and another grid 20 which adjoins the certain grid 20.

FIG. 4 is a drawing showing insulation resistance between a certain grid 20 and another grid 20 which adjoins the certain grid 20. In FIG. 4, the clearance distance of a certain grid 20a and a certain grid 20b is defined as $L_1$. Each of the cathodes 10 is attached on the insulating unit 58, and a connecting unit 56 is positioned between the insulating unit 58 and the bottom of the insulator 40. The cathode 10 and the grid 20 are electrically connected to the cathode power supply 32 and the grid power supply 24 respectively through the connecting unit 56. In this example, the plurality of grids 20 are arranged so that the insulation resistance due to the clearance distance $L_1$ is less than the insulation resistance due to the creepage distance over the surface of the insulator 40, the connecting unit 56 and the insulating unit 58, which is shown as a dotted line 60 in FIG. 4. For this reason, during electric discharge, breakdown between the creepage distance, i.e., between each of the grids 20 over the surface of the insulator 40, the connecting unit 56, and the insulating unit 58, is avoided. Moreover, it is preferable that the distance $L_1$ between each of the grids is smaller than a distance $L_2$ between each of the insulating units 58. Moreover, as shown in FIG. 4, it is preferable that a distal end of the grid 20 is made in a shape of a flange.

Figure 5:
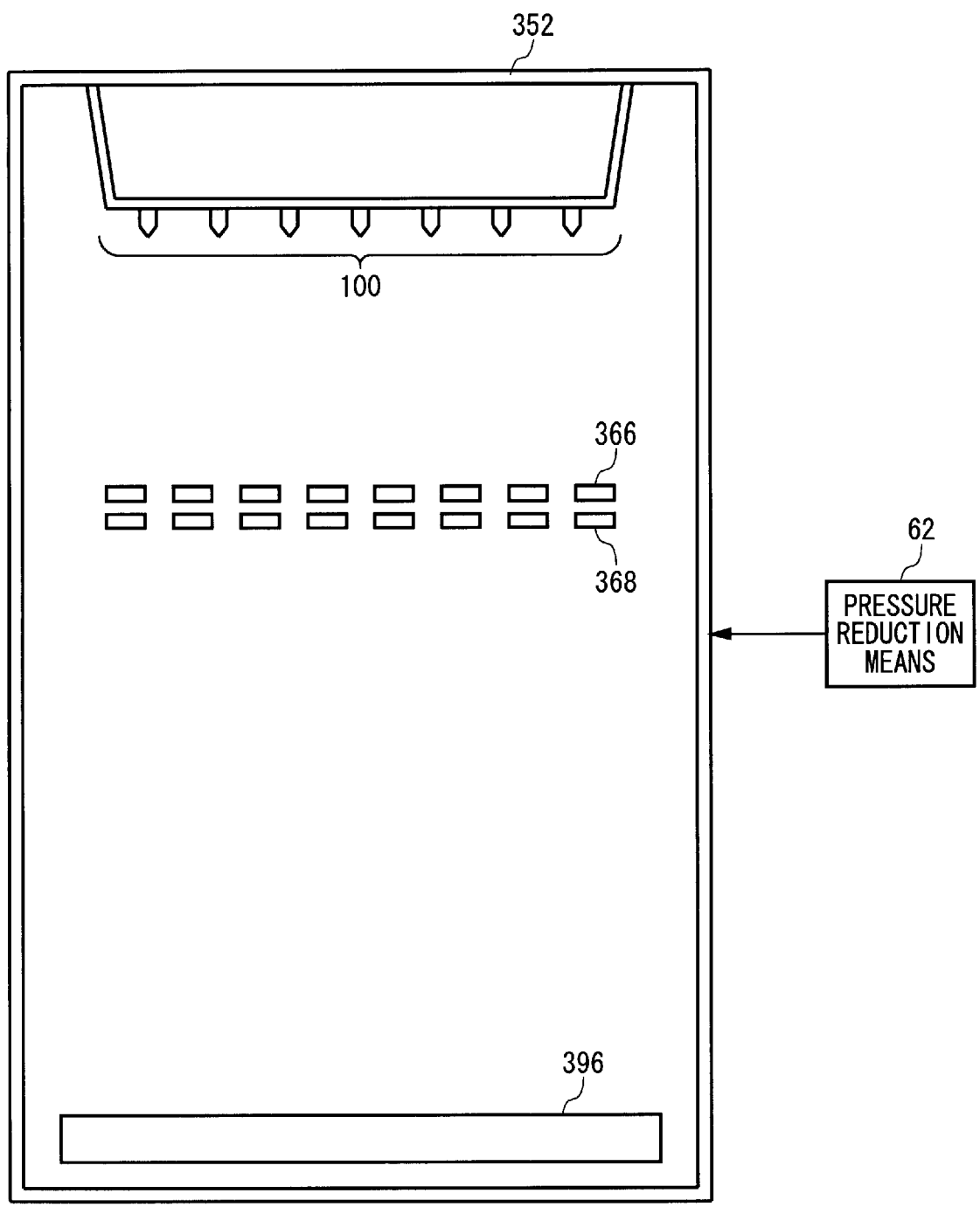
FIG. 5 is a simplified diagram of the electron beam exposure apparatus 300 according to the present invention.

FIG. 5 is a simplified diagram of the electron beam exposure apparatus 300 according to the present invention. The electron beam generating apparatus 300 further includes the electron beam generating apparatus 100, the first shaping deflectors 366 which are deflectors, the second shaping deflectors 368 which are deflectors, and the chamber 352 for storing the stage 396, and a pressure reduction means 62 for reducing a pressure of inside of the chamber 352, and the vacuum area, where the pressure is reduced by the pressure reduction means 62, in the chamber 352 is surrounded by a high resistance film or a conductor. It is preferable that the pressure reduction means 62 is capable of reducing the pressure of the vacuum area of the chamber 352 to about $7.5 \times 10^{-11}$ Pascal ($1 \times 10^{-8}$ torr).

Although the present invention has been described by way of exemplary embodiment, the scope of the present invention is not limited to the foregoing embodiment. Various modifications in the foregoing embodiment may be made when the present invention defined in the appended claims is enforced. It is obvious from the definition of the appended claims that embodiments with such modifications also belong to the scope of the present invention.

As it is obvious from the foregoing explanation, according to the electron beam generating apparatus and the electron beam exposure apparatus of the present invention, a plurality of electron beams can be generated and a wafer can be exposed efficiently. Moreover, the plurality of electron beams can be controlled independently and accurately.

What is claimed is:

1. An electron beam generating apparatus for generating a plurality of electron beams, comprising:
    a plurality of cathodes for generating thermoelectrons;
    a cathode power supply unit for applying negative voltage to said cathodes so as to emit the thermoelectrons from said cathodes;
    a plurality of grids, which correspond to said plurality of cathodes respectively, for focusing the thermoelectrons emitted from each of said plurality of cathodes, and shaping the plurality of electron beams; and
    an insulator on which said plurality of cathodes and said plurality of grids are attached.

2. The electron beam generating apparatus as claimed in claim 1, wherein
    said cathode power supply unit comprises a plurality of cathode power supplies, and
    each of said plurality of cathode power supplies applies negative voltage to said plurality of cathodes.

3. The electron beam generating apparatus as claimed in claim 2, wherein
    said plurality of cathodes are arranged in a gridiron pattern, and
    voltage is applied to said plurality of cathodes, to which voltage is applied from one of said cathode power supplies, in accordance with a distance from a center of the gridiron pattern.

4. The electron beam generating apparatus as claimed in claim 2 or 3, further comprising a first dummy electrode, which is positioned outside of outermost grids among said plurality of grids, on substantially the same surface as bottom surface of said insulator on which said plurality of grids are attached, and at substantially the same height as that of the outermost grids in a direction substantially perpendicular to said insulator.

5. The electron beam generating apparatus as claimed in claim 4, wherein said first dummy electrode comprises a projection which projects from the surface, on which said plurality of grids are provided, to substantially opposite direction of the plurality of grids.

6. The electron beam generating apparatus as claimed in claim 3, wherein said insulator comprises:
    a high resistance film for covering at least a part of external surface of said insulator;
    a first electrode electrically connected to an upper part of said high resistance film; and
    a second electrode electrically connected to a lower part of said high resistance film; and wherein
        said second electrode is electrically connected to one of said plurality of grids through said first dummy electrode, where substantially the same electric potential as said connected grid is applied, and substantially zero electric potential is applied to said second electrode.

7. The electron beam generating apparatus as claimed in one of claims 4–6, further comprises a second dummy electrode, which is positioned in a space insulated from said plurality of cathodes and said plurality of grids by said insulator, and electrically connected to said first dummy electrode.

8. The electron beam generating apparatus as claimed in one of claims 4–7, wherein said second dummy electrode is positioned so as to surround a connection unit which connects said cathode and said cathode power supply unit.

9. The electron beam generating apparatus as claimed in one of claims 1–8, wherein said plurality of grids are arranged so that insulation resistance due to a clearance distance between one of said grids and another grid which adjoins said grid is lower than insulation resistance due to a creepage distance between one of said grids and another grid which adjoins said grid over surface of said insulator.

10. The electron beam generating apparatus as claimed in one of claims 1–9, further comprising a plurality of cathode voltage fine adjustment units, which are positioned corresponding to said cathodes respectively, for adjusting voltage applied to each of said cathodes at higher resolution than that of the voltage generated by said cathode power supply.

11. The electron beam generating apparatus as claimed in one of claims 1–10, further comprising a plurality of grid power supplies for applying voltage to each of said grids in accordance with electric potential of each of said cathodes which corresponds to each of said grids.

12. The electron beam generating apparatus as claimed in claim 11, further comprising a plurality of grid control units for controlling each of said plurality of grid power supplies so as to detect emission current which flows to each of said cathodes in accordance with an amount of the thermoelectrons generated by said plurality of cathodes, and to maintain each of the detected emission current to be substantially constant.

13. The electron beam generating apparatus as claimed in claim 12, further comprising:
    a plurality of filament current sources for supplying filament current for heating said cathodes to said plurality of cathodes respectively;
    a heating-current adjustment unit for adjusting current value of the filament current at each of said cathodes; and
    a heating-current control unit for controlling the current value of the filament current, which is adjusted by each of said heating-current adjustment units based on the current value of the plurality of electron beams which is to be shaped by said plurality of grids.

14. The electron beam generating apparatus as claimed in claim in one of claims 11–13, further comprising a high tension cable comprising:
    a plurality of cathode cables for applying the filament current to each of said plurality of cathodes to which one of said cathode power supplies applies negative voltage;
    a plurality of grid cables for electrically connecting said plurality of grids and said plurality of grid power supplies, where each of said plurality of grids is corresponding to each of said plurality of cathodes to which one of said cathode power supplies applies negative voltage;
    an insulator for insulating said plurality of grid cables; and
    a shield which surrounds the insulator and of which electric potential is substantially the same as one of said plurality of cathodes.

15. The electron beam generating apparatus as claimed in claim in one of claims 1–14, wherein surface area of each of said cathodes is less than 3.5 square millimeters, and volume of each of said cathodes is more than 0.2 cubic millimeters.

16. The electron beam generating apparatus as claimed in claim in one of claims 1–15, further comprising a reflux unit for circulating insulating gas or insulating coolant to a space insulated from said plurality of cathodes and said plurality of grids by said insulator.

17. The electron beam generating apparatus as claimed in claim 16, further comprising a temperature control unit for controlling flow rate of the insulating gas or the insulating coolant in said reflux unit so as to maintain temperature of said insulator to be substantially constant.

18. An electron beam exposure apparatus for exposing a wafer by an electron beam, comprising:

an electron beam generating apparatus for generating the electron beam;
   a deflector for deflecting the electron beam into a desired position on the wafer; and
   a stage for supporting the wafer, and wherein
      said electron beam generating apparatus comprises:
         a plurality of cathodes for generating thermoelectrons;
         a cathode power supply unit for applying negative voltage to said cathodes so as to emit the thermoelectrons from said cathodes;
         a plurality of grids, which correspond to said plurality of cathodes respectively, for focusing the thermoelectrons emitted from each of said plurality of cathodes, and shaping the plurality of electron beams; and
         an insulator on which said plurality of cathodes and said plurality of grids are attached.

19. The electron beam exposure apparatus as claimed in claim 18, further comprising:

a chamber for storing said electron beam generating apparatus, said deflector, and said stage; and
   a pressure reduction means for reducing a pressure of inside of said chamber; and wherein
      a vacuum area, of which the pressure is reduced by said pressure reduction means, in said chamber is surrounded by a high resistance film or a conductor.

* * * * *

UNITED STATES PATENT AND TRADEMARK OFFICE
CERTIFICATE OF CORRECTION

PATENT NO.    : 6,727,658 B2
DATED         : April 27, 2004
INVENTOR(S)   : Yoshihisa Ooae et al.

It is certified that error appears in the above-identified patent and that said Letters Patent is hereby corrected as shown below:

<u>Title page,</u>
Item [30], add -- Foreign Application Priority Data
Nov. 27, 2000  (JP) ………………..2000-360067 --

Signed and Sealed this

Twenty-sixth Day of July, 2005

JON W. DUDAS
*Director of the United States Patent and Trademark Office*